US006648389B2

(12) United States Patent
Frey et al.

(10) Patent No.: US 6,648,389 B2
(45) Date of Patent: *Nov. 18, 2003

(54) PROCESS FOR MANIPULATING COMPONENTS, A MICROTOOL FOR IMPLEMENTING THE PROCESS, AND A PROCESS FOR MANUFACTURING THE MICROTOOL OR MICROTOOL PARTS

(75) Inventors: Wilhelm Frey, Palo Alto, CA (US); Karsten Funk, Palo Alto, CA (US)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/550,789

(22) Filed: Apr. 17, 2000

(65) Prior Publication Data

US 2003/0072646 A1 Apr. 17, 2003

(30) Foreign Application Priority Data

Apr. 15, 1999 (DE) .......................................... 199 16 960

(51) Int. Cl.[7] ................................................. B66C 1/42
(52) U.S. Cl. .......................... 294/86.4; 901/36; 901/38; 294/902
(58) Field of Search ....................... 414/800; 294/86.4, 294/99.1, 902, 88, 106; 901/36, 38

(56) References Cited

U.S. PATENT DOCUMENTS 4,610,475 A * 9/1986 Heiserman ................. 294/86.4

FOREIGN PATENT DOCUMENTS

SU 1579775 * 7/1990 ................. 294/86.4

* cited by examiner

Primary Examiner—Donald W. Underwood
(74) Attorney, Agent, or Firm—Kenyon & Kenyon

(57) ABSTRACT

A microtool for manipulating components is proposed. A component is held with the microtool by at least one gripper arm having a gripping surface, the gripper being movable by an actuator structure. Also provided is a device for releasing the held component from the gripping surface, whereby an acceleration is induced in the gripper arm for at least a time, and the force of inertia resulting from the inertial mass of the held component and the exerted acceleration will be greater than any force of adhesion acting between the held component and the gripping surface. A process is also proposed for producing a microtool or a microtool part, in particular a microgripper by micropatterning. For this purpose, the microtool or the microtool part to be manufactured is patterned out of a layered structure having a base layer, an intermediate layer, and a structuring layer, which is patterned using a masking layer in conformance with the geometry of the microtool to be manufactured; the microtool or the microtool part is patterned out of the structuring layer. Subsequently, the intermediate layer is then undercut (e.g., etched from underneath) in a second etching process.

18 Claims, 2 Drawing Sheets

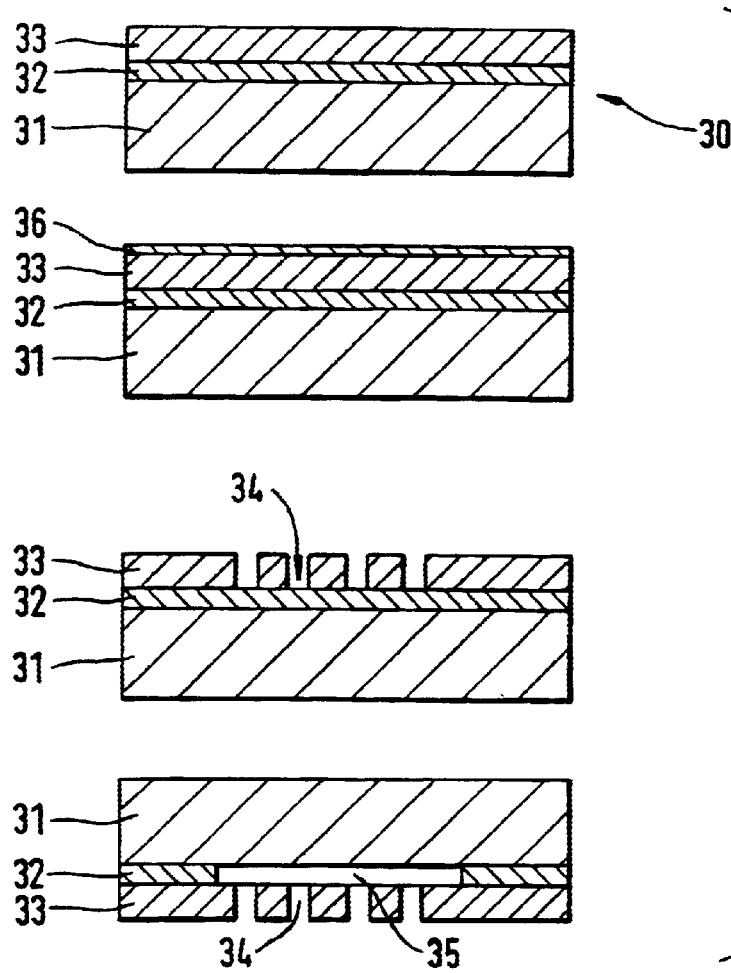
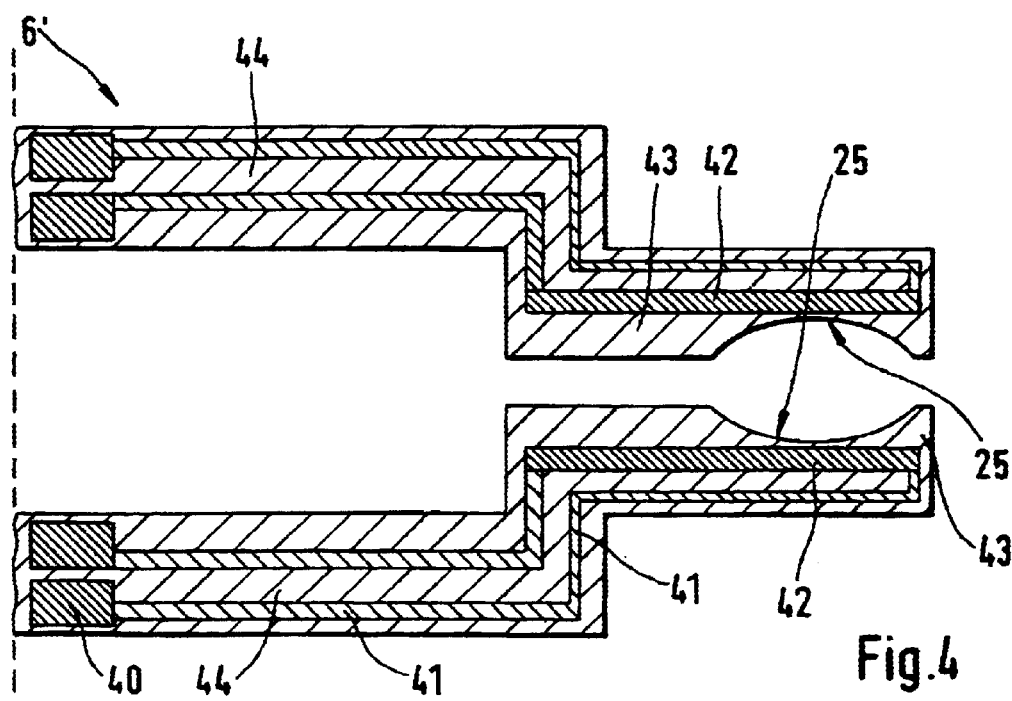

PROCESS FOR MANIPULATING COMPONENTS, A MICROTOOL FOR IMPLEMENTING THE PROCESS, AND A PROCESS FOR MANUFACTURING THE MICROTOOL OR MICROTOOL PARTS

FIELD OF THE INVENTION

The present invention relates to a process for manipulating components, in particular for the precise positioning of microcomponents, a microtool having an integrated release mechanism for carrying out the process, and a process for manufacturing the microtool or at least parts of the microtool, particularly a microgripper or gripper arm.

BACKGROUND INFORMATION

For the assembly of miniaturized systems or microcomponents, such as in microoptics, special demands are placed on the grippers used to manipulate the components that are to be assembled. Unlike grippers used for components having large surfaces, which are known from microelectronics, microoptical grippers, for example, must be able to grasp three-dimensional components by surfaces of varying geometry and place them with precision. However, these extremely small components exhibit some unusual behavior that is characterized by a decrease in volumetric effects and an increase in surface effects.

Conventional microgrippers are fabricated using the methods of precision mechanics. The microcomponent that is to be manipulated is normally picked up by suction in an integrated channel (vacuum gripper), by adhesion on a liquid film or drop (e.g., droplet), or by piezoelectrically activated actuators.

Common to all these methods or tools is that, due to the extremely low mass of the component to be manipulated, releasing the component once it has been held is very problematic. Even after the vacuum is turned off, the suction on the liquid film is removed, or the piezoelectric actuator is turned off, the adhesive forces produced in the gripper may be greater than the force of gravity on the component, so that release of the component is greatly hindered. In particular, it is frequently impossible to position the component precisely for accurate fitting on the target system if the component must be wiped off or blown off.

Precision manufacturing techniques such as drilling or milling are used in the conventional production of grippers made in the form of microtools. In the case of microtools having a typical size less than 2 mm, however, such precision methods of producing individual components are quite expensive.

SUMMARY OF THE INVENTION

The process for manipulating components according to the present invention, the microtool made according to the present invention for implementing the process, and the process for manufacturing the microtool or at least parts of the microtool have the advantage over the prior art that they make possible the simple, precise, and cost-effective micromechanical manufacture of a tool for precise manipulation, positioning, and particularly microassembly of components having typical dimensions in the micrometer range and lower millimeter range.

The microtool or individual microtool parts, particularly the gripper arm or microgripper, can be produced on a conventional silicon production line while, at the same time, the concrete design of the gripper arm or the gripping surface of the microtool can be given any desired two-dimensional form, so that in this way the geometry of the microtool can be quite easily adapted to the component that is to be manipulated. Moreover, the microtool manufacturing process in accordance with the present invention is suitable for batch production or series production, which makes it quite cost-effective.

Moreover, it is particularly advantageous if the process in accordance with the present invention for producing the microtool or microtool parts is based on the micropatterning of a layered structure having a base layer, an intermediate layer, and a structuring (patterning) layer, as previously known, for example, in the form of an SOI wafer ("silicon on insulator"). Thus, the microtool can be easily patterned in a conventional manner out of the structuring layer by applying an additional masking layer suitable to the desired geometry of the microtool or microtool part being manufactured and then using a likewise conventional etching process.

Thus, the component held by the microtool is released in an advantageous manner using a plate structure arranged in the vicinity of a gripper arm, an actuator layer that is at least in part connected to the gripper arm, in particular a piezoelectric or piezoresistive layer, an ultrasound transmitter located in the vicinity of the gripper arm, or an actuator that is connected to and/or interacts with the gripper arm.

Moreover, it is advantageous if the microtool has at least two opposing, especially symmetrically arranged, gripper arms for holding a component. It is further advantageous if the gripper arms are connected to an anchor by a movable crosspiece or a soft spring. This anchor serves as a fixed point for the otherwise largely freely movable gripper arms.

In addition, it is advantageous if the designated actuator structure that is connected to the gripper arms is made in the form of an anchored comb structure and an associated comb structure on the leg of the gripper arms, thereby forming a conventional interdigital capacitor which can be used to cause the gripper arms to move and produce controlled attachment and release of the component.

BRIEF DESCRIPTION OF THE DRAWINGS

FIG. 3 shows individual processing steps for producing the microgripper.

FIG. 4 shows a second microgripper in an alternative embodiment.

DETAILED DESCRIPTION

Figure 1:
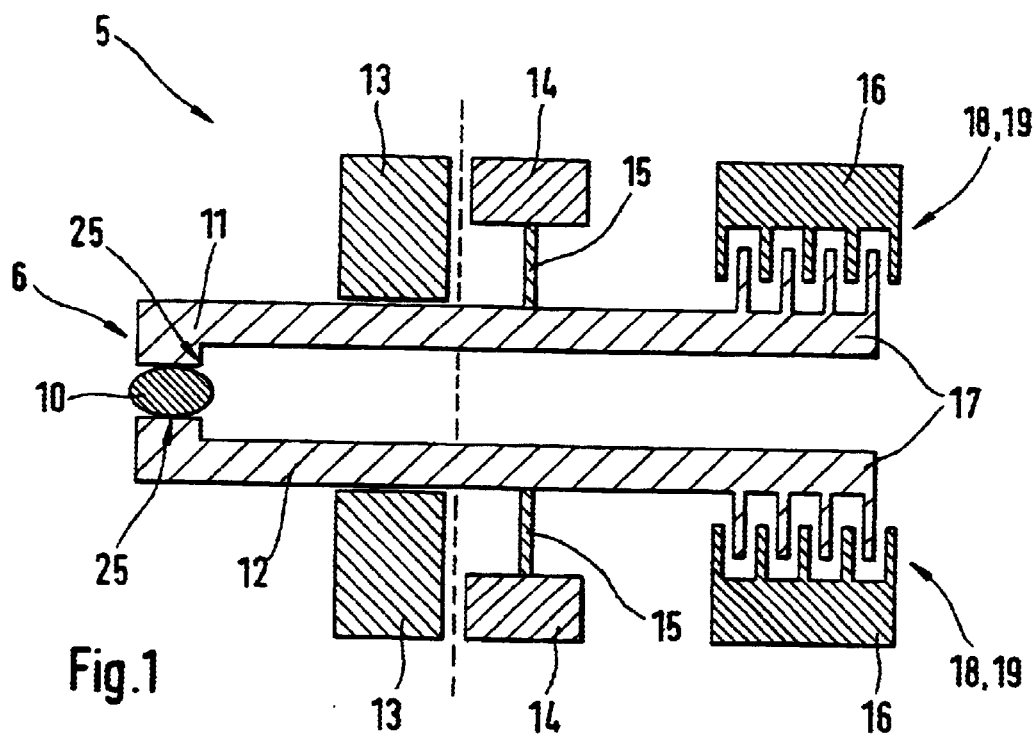
FIG. 1 shows a microtool having a first microgripper according to the present invention.

FIG. 1 shows a first embodiment of a microtool 5 made according to the present invention, which can be used to implement the process according to the present invention for manipulating components 10, in particular microcomponents, and which was manufactured completely or at least in individual microtool parts, especially with respect to gripper arms 11, by the process of the present invention for manufacturing microtool 5 or microtool parts.

Microtool 5 has a first microgripper 6, which is made of two symmetrical gripper arms 11 that face each other and may be moved by an actuator structure 19. Gripper arms 11 hold a component 10, which is a microcomponent, in a clamp-like manner. The microcomponent may be, for example, an optical microlens having a typical diameter of 500 μm. Each of gripper arms 11 has a leg 12, which is connected to an anchor 14, by way a resilient crosspiece 15 or a soft spring, as a fixed reference point. Thus, gripper arms 11 are cantilevered and attached to provide a pivoting motion via crosspieces 15 and anchors 14. Furthermore, the end of legs 12 facing component 10 has a finger-like leg comb structure 17, which engages in or extends into a correspondingly adapted, assigned, finger-like, anchored comb structure 16, thereby forming a conventional interdigital capacitor 18 to be used as actuator structure 19. In the example presented here, legs 12 are approx. 100 μm to 1 mm long.

Gripper arms 11 can be induced to grasp and release component 10 by applying voltages $U_1$ to interdigital capacitor 18 by components that are not shown here, for example using an electrostatic interaction. In addition, anchor 14, actuator structure 19, plate structure 13 and gripper arms 11 are positioned with a high degree of precision relative to each other during assembly on supports (not shown).

Moreover, a plate structure 13 is arranged symmetrically in the vicinity of each leg 12. These plate structures 13 are connected to components that are not shown to supply a voltage and, in particular, to apply an electrical charge to the plate structures.

Gripper arms 11 hold component 10 in a clamp-like manner using the forces exerted by interdigital capacitor 18 and they touch component 10 with gripping surfaces 25. In addition to the forces exerted to hold component 10, so-called adhesion forces are unavoidably and constantly present between this component and gripping surfaces 25, i.e., attractive forces acting between gripping surface 25 and the surface area of component 10 that is in contact with gripping surface 25, causing adhesion of component 10 to gripper arm 11. These forces are undesirable when it comes to releasing component 10 from gripping surfaces 25 since they have a significant adverse effect on the precision releasing and on a high-precision positioning of component 10.

Figure 2:
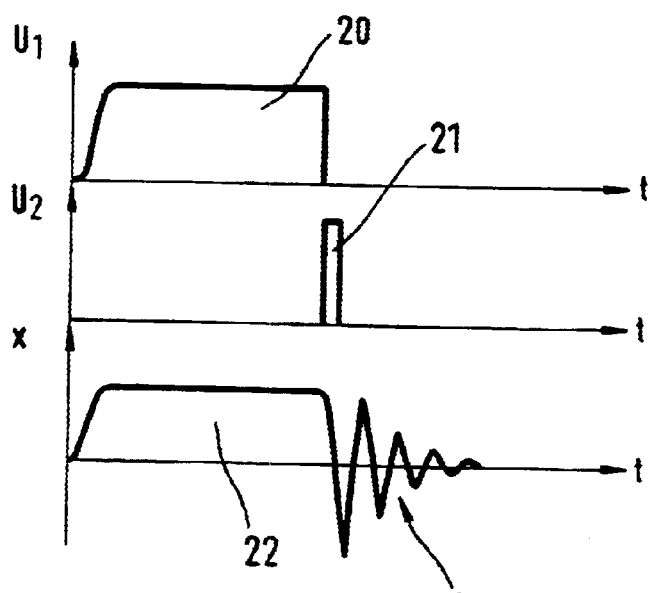
FIG. 2 shows voltages applied to individual components of the microtool as a function of time and the resulting deflection of the gripper arms of the microtool shown in FIG. 1.

Thus, as shown in FIG. 2, each plate structure 13 has a brief voltage $U_2$ applied to it when it is time to release component 10 at a desired position, in particular a position into which the unit has been placed by a robot. Thus, FIG. 2 first shows that component 10 is held and aligned during a holding pulse 20 by a voltage $U_1$ applied to interdigital capacitors 18. As soon as this voltage $U_1$ is shut off, component 10 is released by microgripper 6 and gripper arms 11. To avoid an undesired misplacement, due to the adhesive forces, of component 10 at the moment microgripper 6 opens, a brief releasing pulse 21, in the form of an applied voltage $U_2$, is induced in each plate structure 13. This releasing pulse 21, with suitable polarity and voltage level, produces an electrostatic force that exerts a brief acceleration in both gripper arms 11, so that the force of inertia resulting from the inertial mass of component 10 and the acceleration will be greater, in particular much greater, than the force of adhesion between component 10 and gripping surface 25. Thus, the force of inertia brought about by plate structure 13 and releasing pulse 21 opposes the forces of adhesion.

The induced acceleration leads, in particular, to a high-frequency vibration or oscillation in gripper arm 11, thereby causing component 10 to be shaken loose from microgripper 6 in an effective and highly precise manner. This prevents undesired misplacement of component 10 during the instant it is released from microgripper 6, thereby permitting highly accurate manipulation of components of this type.

FIG. 2 further shows how, during the phase in which component 10 is held during a holding phase 22, gripper arms 11 of microgripper 6 are constantly deflected with deflection x by applied voltage $U_1$ from actuator structure 19. When component 10 is released, this deflection is returned to the initial or resting position by the resilient forces caused by crosspieces 15. At the same time, however, a damped releasing oscillation 23 in the form of a high-frequency vibration of gripper arms 11 is caused by plate structure 13 and releasing pulse 21 induced across it.

In addition to plate structure 13 which in the example above forms a capacitor together with corresponding leg 12, releasing pulse 21 or, in general, the required acceleration of gripper arms 11 can also be caused in a similar manner by an actuator layer, in particular a piezoelectric or piezoresistive layer, that is at least partially connected to gripper arm 11, an ultrasound transmitter located in the vicinity of gripper arm 11, or an actuator that is connected to and/or interacts with gripper arm 11. The essence of the present invention is the acceleration that is caused at the proper time and that is of sufficient magnitude, which can be produced in any number of ways.

Depending on the component dimensions, voltages $U_1$ and $U_2$ in the example above lie in the range of 0.5 V to 100 V, and the duration of releasing pulse 21 is, for example, 0.01 ms to 100 ms. The time during which releasing pulse 21 induces the desired acceleration during the release of component 10 is preferably chosen in such a way as to induce a vibration or oscillation, in particular a high-frequency vibration or oscillation, in gripper arm 11. It is particularly preferable that this length of time be adjusted in such a way that the acceleration produced over this time period is induced only during a period of time that is sufficient to excite a resonant oscillation of an oscillation eigenmode, in particular a higher oscillation eigenmode of gripper arm 11. It is particularly preferred that it be greater than the frequency of a first oscillation eigenmode of gripper arm 11, so that, on the one hand, gripper arm 11 takes on energy and vibrates at resonance and, on the other hand, a high-frequency oscillation or vibration of the gripper arm is excited that has only a small amplitude, so that component 10 is shaken off with maximum positioning accuracy. In this case, the return swing of leg 12, which occurs in any event, can be used to intensify a return deflection.

By exciting a higher oscillation eigenmode of gripper arm 11, a high acceleration is produced on the one hand, while only a small deflection of gripper arms 11 occurs on the other.

Specific values of the oscillation frequency to be used can be calculated on a case-by-case basis by those skilled in the art, based on the inertial mass of component 10. In particular, the dimensions of gripper arm 11 and/or the frequency of the high-frequency vibration or oscillation caused, for example, by plate structure 13 must be matched to this inertial mass of component 10, which is held, since the required acceleration is determined by the inertial mass of component 10 and the magnitude of the adhesion force in question.

No additional explanation or details will be given regarding the movement of gripper arms 11, interdigital capacitors 18, the attachment of gripper arms 11 by crosspieces 15, or the specific shape of leg 12, since these are known to those skilled in the art.

It is obvious that, if necessary, actuator structure 19, plate structure 13, anchor 14, crosspieces 15, and gripper arms 11 can be connected to or provided with conductive traces and/or terminal pad surfaces in a conventional manner for electrical contact or supplying power or for application of a voltage. Moreover, microtool 5 or parts of microtool 5 can be fully or partially coated with metal in a conventional manner.

Otherwise, microtool 5, particularly microgripper 6 having gripper arms 11, actuator structure 19, plate structure 13, crosspiece 15, and anchor 14, are preferably made of silicon, especially of polysilicon. However, other materials such as germanium, metals such as nickel or cobalt, or materials in general that may be patterned by microtechnology, are other possibilities.

As a second example, FIG. 4 shows an additional embodiment of a second microgripper 6' having legs 44, gripper arms 43, an actuator layer 42, conductive traces 41, and terminal pads 40, which has been modified, compared to first microgripper 6. However, FIG. 4 shows only the part of second microgripper 6' in the vicinity of component 10 (indicated in FIG. 1 by a broken line). In particular, actuator structure 19, anchor 14, and crosspieces 15 are not shown, although, as in FIG. 1, they are designed as extensions of legs 44. Second microgripper 6', as a part of microtool 5, is also made of silicon or polysilicon, and it is approximately the same size as first microgripper 6 shown in FIG. 1.

Significant differences between second microgripper 6' and first microgripper 6 are found only in the type of excitation used for the brief acceleration to release or shake off component 10. For this purpose, there is an actuator structure 42 applied to the surface of second microgripper 6', which is preferably made in the form of diffused piezoresistors, a piezoresistive layer, or a deposited piezoelectric layer, for example of ZnO. Many such piezoresistive or piezoelectric layers, resistors, or actuators and processes for making them are known.

Conductive traces 41 are applied by patterned metallization, using aluminum for example. Terminal pads 40 provide, for example, electrical control of actuator layer 42 and are connected to the latter via conductive traces 41. Thus, in the embodiment shown in FIG. 4, the required acceleration is produced by a brief voltage, $U_2$, applied to actuator layer 42 whereby, as in the first embodiment, the applied voltage $U_2$ induces a high-frequency oscillation or vibration in gripper arms 11, 44 due to the piezoelectric effect. Consequently, plate structure 13 is not required in this case.

Otherwise, the remarks above, particularly with regard to the structure of microtool 5 and microgripper 6, and to the process for manipulating components, also apply to the embodiment including second microgripper 6', as shown in FIG. 4.

Moreover, in an alternative embodiment of microgripper 6, an ultrasound transmitter is arranged in a conventional manner in the vicinity of gripper arms 11, instead of plate structure 13, in order to provide the required oscillation or vibration of gripper arms 11 and, thus, to produce the required acceleration.

The process according to the present invention for producing microtool 5 or microtool parts for microtool 5, in particular microgripper 6 or 6' of gripper arm 11, 44, plate structure 13, and actuator structure 19 is explained with the help of FIG. 3.

The raw material used is a layered structure 30, a conventional SOI wafer, on which a standard lithographic process is applied using a masking layer 36 to define the desired structures (i.e., patterns) of microtool 5 or of the microtool part to be manufactured. Here, layered structure 30 preferably includes a base layer 31 of silicon or polysilicon, an intermediate layer 32 of silicon dioxide, or some other oxide, and a structuring layer 33 made of silicon or polysilicon.

Once masking layer 36 is patterned as desired, a first etching process etches structuring layer 33 to form trenches 34, which are defined by masking layer 36. The first etching process is, for example, a conventional dry plasma etching process that provides isotropic, vertical etching of structuring layer 33 by way of trenches 34, and selectively etches structuring layer 33, so that when the first etching process reaches intermediate layer 32, it comes almost to a complete halt. Thus, in this process, intermediate layer 32 is used as an etch stop layer.

Subsequently, masking layer 36 is removed again in a conventional manner and, in a second etching process, layered structure 30 is then preferably etched upside down, i.e., oriented with structuring layer 33 down, in an isotropic standard gas-phase etching process. Starting from trenches 34, this second etching process selectively etches only intermediate layer 32, now used as a sacrificial layer, so that it is etched away from underneath structuring layer 33 at least in the vicinity of the microtool or microtool part. Thus, this second etching process does not act on or etch patterned microtool 5 or the microtool part. Etching underneath (undercutting) structuring layer 33 forms a cavity 35, so that microtool 5 or the microtool part to be produced is exposed and falls out of remaining layered structure 30 by virtue of the force of gravity.

Microtool 5 or the microtool part produced in this way can then be overetched in a conventional manner to improve its structure, after which it is ready for assembly. Moreover, structuring layer 33 can also be metallized or coated on its surface, at least in part, even before masking layer 36 is applied, for example, so that in this way conductive traces 41 and/or terminal pads 40 and/or actuator layer 42 are already in place. Actuator layer 42 is, for example, the aforementioned deposited piezoresistive or piezoelectric layer. Alternatively, however, actuator layer 42, conductive traces 41, and terminal pads 40 can also be applied in a conventional manner on structuring layer 33, after the structuring of the latter.

Reference Numerals
5 microtool
6 first microgripper
6' second microgripper
10 component
11 gripper arm
12 leg
13 plate structure
14 anchor
15 crosspiece
16 anchored comb structure
17 leg comb structure
18 interdigital capacitor
19 actuator structure
20 holding pulse
21 releasing pulse
22 holding phase
23 releasing oscillation
25 gripping surface
30 layered structure
31 base layer
32 intermediate layer 33 structuring layer
34 trench
35 cavity
36 masking layer
40 terminal pad
41 conductive trace
42 actuator layer
43 gripper arm
44 leg

What is claimed is:

1. A microtool for manipulating or positioning a microcomponent, comprising:
   a gripper structure having a first arm a second arm, and at least one gripping surface, the gripper structure positioning at least one microcomponent into a predetermined position using the at least one gripping surface;
   a first actuator structure moving the gripper structure, the actuator structure including an interdigital capacitor, the interdigital capacitor including an anchored comb structure and a eg comb structure of a leg; and
   at least one arrangement producing at east a temporary acceleration of at least one of the first arm and the second arm such that a first force of inertia is greater than a second force of adhesion, the first force of inertia being generated by an inertial mass of the at least one microcomponent and the at least temporary acceleration, the second force of adhesion acting between the at least one microcomponent and the at least one gripping surface.

2. The microtool according to claim 1, wherein the gripper structure engages the at least one microcomponent in a clamp-like manner.

3. The microtool according to claim 1, wherein at least for a predetermined time period, the first force opposes the second force.

4. The microtool according to claim 1, wherein the at least one arrangement includes a plate structure, a part of the plate structure being situated in a vicinity of the gripper structure.

5. The microtool according to claim 1, wherein the at least one arrangement includes an actuator layer at least in part connected to the gripper structure.

6. The microtool according to claim 5, wherein the actuator layer includes one of a piezoelectric layer and a piezoresistive layer.

7. The microtool according to clam 1, further comprising:
   an anchor; and
   a movable crosspiece connecting the gripper structure to the anchor.

8. The microtool according to claim 1, further comprising:
   an anchor; and
   a soft spring connecting the gripper structure to the anchor.

9. The microtool according to claim 5, wherein the actuator layer is connected, via a conductor trace, to at least one terminal pad to create an electrical contact.

10. The microtool according to claim 1, wherein the first arm and the second arm are mutually opposed to each other and form a microgripper.

11. The microtool according to claim 7, wherein the first and second arms are symmetrical.

12. A microtool for manipulating or positioning a microcomponent, comprising:
   a gripper structure having a first arm, a second arm, and at least one gripping surface, the gripper structure positioning at least one microcomponent into a predetermined position using the at least one gripping surface;
   at least one actuator structure moving the gripper structure; and
   at least one arrangement producing at least a temporary acceleration of at least one of the first arm and the second arm such that a first force of inertia is greater than a second force of adhesion, the first force of inertia being generated by an inertial mass of the at least one microcomponent and the at least temporary acceleration, the second force of adhesion acting between the at least one microcomponent and the at least one gripping surface, wherein the at least one arrangement includes an ultrasound transmitter arranged in a vicinity of the gripper structure.

13. The microtool according to claim 1, wherein the at least one arrangement includes an actuator which at least one of (i) connected to the gripper structure and (ii) interacts with the gripper structure.

14. The microtool according to claim 1, wherein the at least one arrangement is configured to produce the at least temporary acceleration by inducing oscillation of the at least one of the first arm and the second arm.

15. The microtool according to claim 1, wherein the at least one arrangement is configured to produce the at least temporary acceleration by inducing a resonant oscillation of the at least one of the first arm and the second arm.

16. The microtool according to claim 12, wherein the at least one arrangement is configured to produce the at least temporary acceleration by inducing a high frequency oscillation of the at least one of the first arm and the second arm.

17. The microtool according to claim 1, wherein the at least one arrangement is configured to produce the at least temporary acceleration by inducing a vibration of the at least one of the first arm and the second arm.

18. The microtool according to claim 12, wherein the at least one arrangement is configured to produce the at least temporary acceleration by inducing a high frequency vibration of the at least one of the first arm and the second arm.

* * * * *

UNITED STATES PATENT AND TRADEMARK OFFICE
CERTIFICATE OF CORRECTION

PATENT NO.   : 6,648,389 B2
DATED        : November 18, 2003
INVENTOR(S)  : Wilhelm Frey et al.

It is certified that error appears in the above-identified patent and that said Letters Patent is hereby corrected as shown below:

Column 7,
Line 20, change "eg comb" to -- leg comb --.
Line 21, change "at east a" to -- at least a --.

Signed and Sealed this

Sixteenth Day of November, 2004

JON W. DUDAS
*Director of the United States Patent and Trademark Office*